(12) United States Patent
Hung et al.

(10) Patent No.: US 8,258,825 B2
(45) Date of Patent: Sep. 4, 2012

(54) SPREAD SPECTRUM CIRCUIT

(75) Inventors: Ching-Ho Hung, Hsinchu (TW);
Yung-Cheng Lin, Hsinchu County (TW); Po-Yu Tseng, Taoyuan County (TW)

(73) Assignee: Novatek Microelectronics Corp., Hsinchu (TW)

( * ) Notice: Subject to any disclaimer, the term of this patent is extended or adjusted under 35 U.S.C. 154(b) by 31 days.

(21) Appl. No.: 12/892,571

(22) Filed: Sep. 28, 2010

(65) Prior Publication Data
US 2011/0254596 A1  Oct. 20, 2011

(30) Foreign Application Priority Data
Apr. 20, 2010  (TW) .............................. 99112422 A

(51) Int. Cl.
*H03K 3/00* (2006.01)
(52) U.S. Cl. ......... 327/112; 327/170; 327/172; 327/263
(58) Field of Classification Search .......... 327/108–109, 327/111–112, 170–175, 263, 265; 326/22–24, 326/85–87
See application file for complete search history.

(56) References Cited

U.S. PATENT DOCUMENTS

| | | | | |
|---|---|---|---|---|
| 5,491,429 A * | 2/1996 | Gasparik | ........................ | 326/27 |
| 6,366,151 B1 * | 4/2002 | Nakamura | ..................... | 327/281 |
| 6,462,597 B2 * | 10/2002 | Lee | ................. | 327/261 |
| 6,753,707 B2 * | 6/2004 | Honda et al. | .................. | 327/108 |

* cited by examiner

*Primary Examiner* — An Luu
(74) *Attorney, Agent, or Firm* — Rabin & Berdo, P.C.

(57) ABSTRACT

A spread-spectrum circuit including an inverter, a current source, a control unit and a shaping circuit is provided. An input terminal of the inverter receives an original clock signal. The current source is coupled to a current transmission terminal of the inverter. The control unit includes a control circuit, and changes the current magnitude of the current source according to the original clock signal to control the charging/discharging speed of an output terminal of the inverter, so that the output terminal outputs a voltage signal. The shaping circuit shapes the voltage signal into a spread-spectrum clock signal.

8 Claims, 2 Drawing Sheets

SPREAD SPECTRUM CIRCUIT

This application claims the benefit of Taiwan application Serial No. 99112422, filed Apr. 20, 2010, the subject matter of which is incorporated herein by reference.

BACKGROUND OF THE INVENTION

1. Field of the Invention

The invention relates in general to a spread-spectrum circuit, and more particularly to a spread-spectrum circuit with low complexity.

2. Description of the Related Art

Along with the advance in technology, full high definition (Full HD) frame and high frame rate are inevitable trends for liquid crystal display (LCD). However, as the resolution level and the frame rate are increased, data transmission volume also increases significantly, and the frequency of transmission signal also becomes higher. When data is transmitted by way of high frequency transmission, a considerable amount of electromagnetic radiation (that is, the electromagnetic interference (EMI) effect) will be generated. Thus, how to decrease the EMI effect has become a prominent task in the design of LCD circuit.

SUMMARY OF THE INVENTION

The invention is directed to a spread-spectrum circuit capable of spreading the spectrum of an input signal with a simple inverter to decrease the electromagnetic interference (EMI) effect without using additional control signal and having the advantages of easy implementation and low complexity.

According to a first aspect of the present invention, a spread-spectrum circuit including an inverter, a current source, a control unit and a shaping circuit is provided. The inverter input terminal receives an original clock signal. The current source is coupled to a current transmission terminal of the inverter. The control unit includes a control circuit, and changes the current magnitude of the current source according to the original clock signal to control the charging/discharging speed of an output terminal of the inverter, so that the output terminal outputs a voltage signal. The shaping circuit shapes the voltage signal into a spread-spectrum clock signal.

According to a second aspect of the present invention, a spread-spectrum circuit including an inverter, a first current source, a second current source, a loading, a control unit and a shaping circuit is provided. The inverter receives an original clock signal. The first current source is coupled to a first terminal of the inverter. The second current source is coupled to a second terminal of the inverter. The loading is coupled to an output terminal of the inverter. The control unit includes a control circuit, and changes the current magnitudes of the first current source and the second current source according to the original clock signal to control the speed of the inverter in charging/discharging the loading, so that the output terminal outputs a voltage signal. The shaping circuit shapes the voltage signal into a spread-spectrum clock signal.

The above and other aspects of the invention will become better understood with regard to the following detailed description of the preferred but non-limiting embodiment(s). The following description is made with reference to the accompanying drawings.

DETAILED DESCRIPTION OF THE INVENTION

The invention provides a spread-spectrum circuit capable of spreading the spectrum of an input signal with a simple inverter to decrease the electromagnetic interference (EMI) effect without using additional control signal and having the advantages of easy implementation and low complexity.

The invention provides a spread-spectrum circuit, which includes an inverter, a current source, a control unit and a shaping circuit. The inverter input terminal receives an original clock signal. The current source is coupled to a current transmission terminal of the inverter. The control unit includes a control circuit, and changes the current magnitude of the current source according to the original clock signal to control the charging/discharging speed of an output terminal of the inverter, so that the output terminal outputs a voltage signal. The shaping circuit shapes the voltage signal into a spread-spectrum clock signal. In the following disclosure, the inverter is exemplified by a CMOS inverter, but the invention is not limited thereto.

Figure 1:
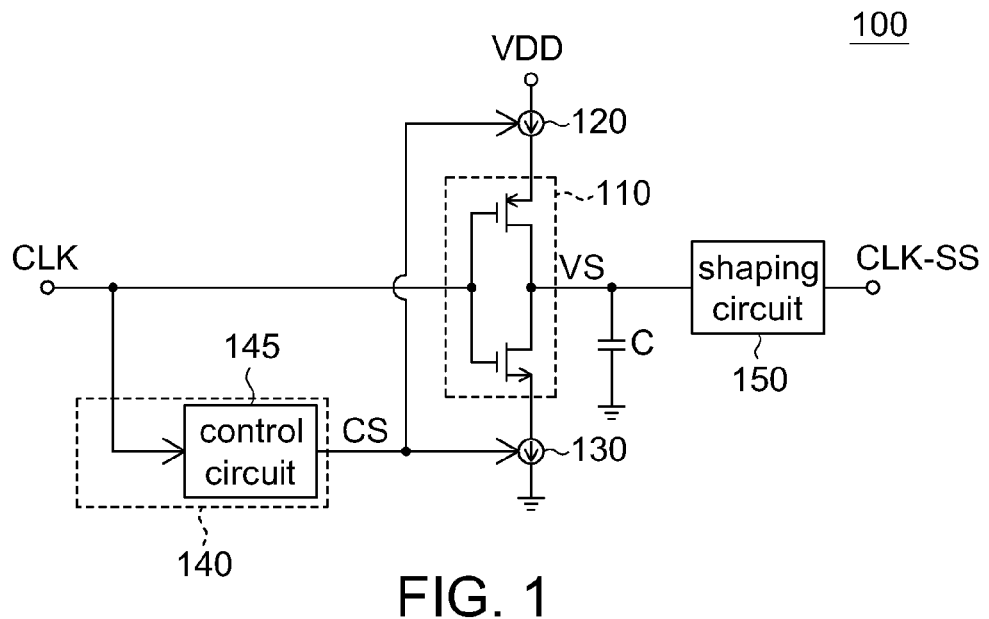
FIG. 1 shows a circuit diagram of an example of a spread-spectrum circuit according to a preferred embodiment of the invention.
Figure 2:
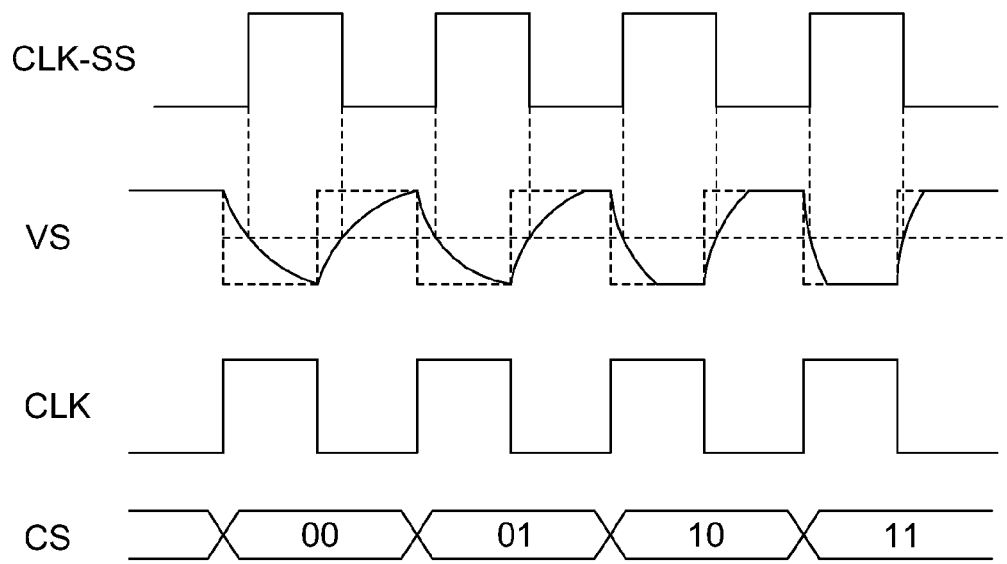
FIG. 2 shows a wave pattern of a spread-spectrum circuit according to a preferred embodiment of the invention.

Referring to FIG. 1 and FIG. 2. FIG. 1 shows a circuit diagram of an example of a spread-spectrum circuit according to a preferred embodiment of the invention. FIG. 2 shows a wave pattern of a spread-spectrum circuit according to a preferred embodiment of the invention. In FIG. 1, the spread-spectrum circuit 100 includes a CMOS inverter 110, a first current source 120, a second current source 130, a capacitor C, a control unit 140 and a shaping circuit 150. The CMOS inverter 110 receives an original clock signal CLK. The first current source 120 is coupled to a first terminal of the CMOS inverter 110. The second current source 130 is coupled to a second terminal of the CMOS inverter 110. The capacitor C is coupled to an output terminal of the CMOS inverter 110.

The control unit 140 includes a control circuit 145, and the control circuit 145 changes the current magnitudes of the first current source 120 and the second current source 130 according to the original clock signal CLK to control the speed of the CMOS inverter 110 in charging/discharging the capacitor C, so that the output terminal outputs a voltage signal VS. The control circuit 145 can be realized by a counter, and the current magnitudes of the first current source 120 and the second current source 130 vary with a count of the counter. The counter can be realized by such as an N-bit counter, a random counter or an up down counter, and the invention does not impose any restriction on the counter as long as the counter enables the current magnitudes of the first current source 120 and the second current source 130 with regular change.

In FIG. 2, the control circuit 145 is exemplified by a 2-bit counter. The control circuit 145 counts the original clock signal CLK and accordingly outputs a control signal CS which controls the first current source 120 and the second current source 130 and obtains current with regular change. The current with regular change charges/discharges the capacitor C to obtain a voltage signal VS. Since the control signal CS changes the current magnitudes of the first current source 120 and the second current source 130, the voltage signal VS can be obtained from the transformation of the inverse of the original clock signal CLK.

Figure 3:
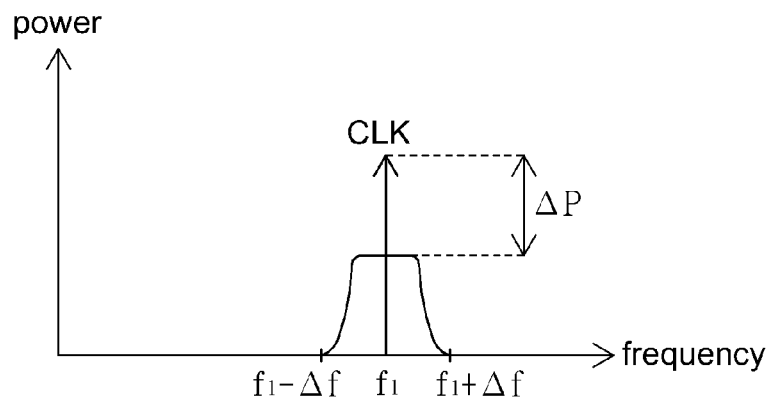
FIG. 3 shows a frequency spectrum of a spread-spectrum circuit according to a preferred embodiment of the invention.

Afterwards, the shaping circuit 150 shapes the voltage signal VS into a spread-spectrum clock signal CLK-SS. The shaping circuit 150 can be formed by an inverter, an ordinary logic gate circuit or a computing amplifier, and no particular restriction is imposed. Referring to FIG. 3, a frequency spectrum of a spread-spectrum circuit according to a preferred embodiment of the invention is shown. In comparison to the single frequency $f_1$ of the original clock signal CLK, the frequency of the spread-spectrum clock signal CLK-SS is distributed between $(f_1+\Delta f) \sim (f_1-\Delta f)$ after the spread-spectrum process. The peak power of the spread-spectrum clock signals CLK-SS are lower than that of the original clock signal CLK by $\Delta P$, so the peak power is reduced and the electromagnetic interference effect is decreased.

Besides, the span of the spread-spectrum must be controlled to be within a certain range lest the spread-spectrum clock signals CLK-SS and the original clock signal CLK might differ widely in the duty cycle so as to incapacitate the next stage circuit. Thus, the span of the spread-spectrum can be controlled by controlling the change in the current magnitudes of the first current source 120 and the second current source 130 not to exceed a threshold. The control circuit 145 can be used for controlling the change in the current magnitudes of the first current source 120 and the second current source 130 not to exceed a threshold.

Figure 4:
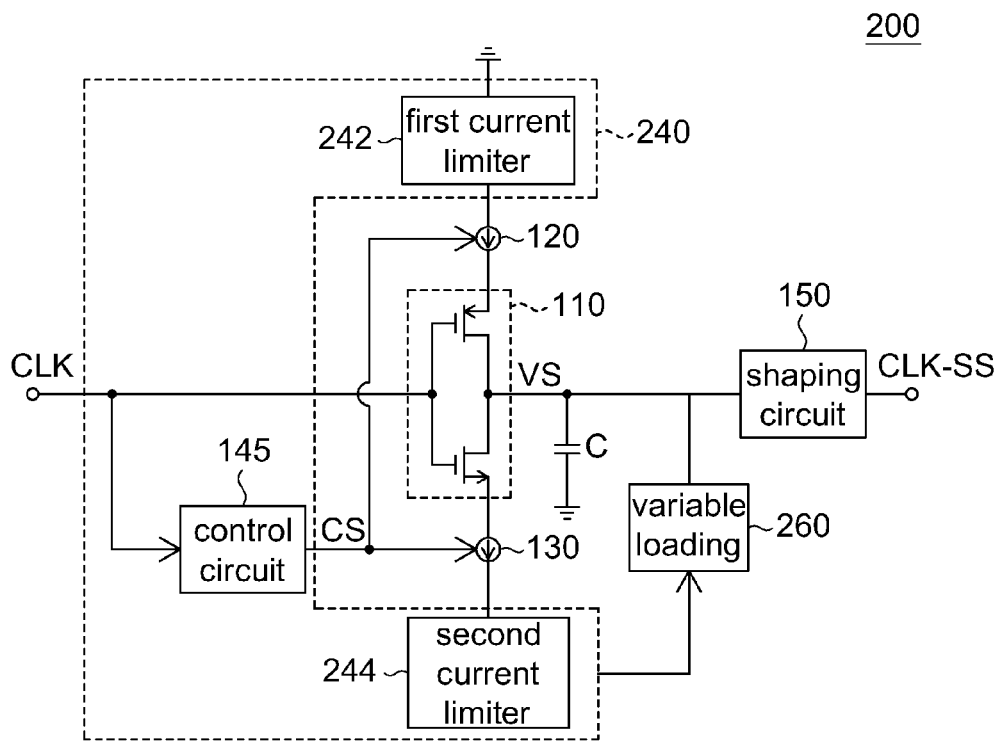
FIG. 4 shows a circuit diagram of another example of a spread-spectrum circuit according to a preferred embodiment of the invention.

As indicated in FIG. 4, a circuit diagram of another example of a spread-spectrum circuit according to a preferred embodiment of the invention is shown. In comparison to the spread-spectrum circuit 100, the control unit 240 of the spread-spectrum circuit 200 of FIG. 4 further includes a first current limiter 242 and a second current limiter 244, wherein the first current limiter 242 is coupled to the first current source 120, and the second current limiter 244 is coupled to the second current source 130. The control unit 240, through the first current limiter 242 and the second current limiter 244, respectively controls the changes in the current magnitudes of the first current source 120 and the second current source 130 not to exceed a threshold. Besides, the above effect can also be achieved by coupling a fixed loading to the output terminal of the CMOS inverter 110.

Also, a variable loading 260 can be coupled to the output terminal of the CMOS inverter 110. Thus, the control unit 240 controls the magnitude of the variable loading 260 so as to limit the speed of the CMOS inverter 110 in charging/discharging the capacitor C, so that the spread-spectrum clock signal CLK-SS and the original clock signal CLK will not differ widely in the duty cycle.

The above methods of controlling the current source, the current limiter and the fixed/variable loading can be implemented separately or mixed together, and the spread-spectrum still can be achieved.

The spread-spectrum circuit disclosed in the above embodiments of the invention has many advantages exemplified below:

The spread-spectrum circuit of the invention changes the current magnitude of the inverter in charging/discharging the capacitor through current control, so that the spread-spectrum effect can be achieved by controlling the charging/discharging time without using additional control signal, the peak power is reduced and the electromagnetic interference effect is decreased. Since smaller amount of circuits is used, the implementation is easier and the complexity is decreased.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A spread-spectrum circuit, comprising:
   an inverter whose input terminal is used for receiving an original clock signal;
   a current source coupled to a current transmission terminal of the inverter;
   a control unit comprising a counter, the current magnitude of the current source varies with a count of the counter, and the control unit is used for changing the current magnitude of the current source according to the original clock signal to control the charging/discharging speed of an output terminal of the inverter, so that the output terminal outputs a voltage signal; and
   a shaping circuit used for shaping the voltage signal into a spread-spectrum clock signal.

2. The spread-spectrum circuit according to claim 1, wherein the counter is an N-bit counter, a random counter or an up down counter.

3. The spread-spectrum circuit according to claim 1, wherein the counter controls a change in the current magnitude of the current source not to exceed a threshold.

4. The spread-spectrum circuit according to claim 1, further comprising:
   a variable loading coupled to the output terminal of the inverter, wherein a magnitude of the variable loading is controlled by the control unit to limit the charging/discharging speed of the output terminal of the inverter.

5. A spread-spectrum circuit, comprising:
   an inverter used for receiving an original clock signal;
   a first current source coupled to a first terminal of the inverter;
   a second current source coupled to a second terminal of the inverter;
   a capacitor, coupled to an output terminal of the inverter;
   a control unit comprising a counter, the current magnitude of the current source varies with a count of the counter, and the control unit is used for changing current magnitudes of the first current source and the second current source according to the original clock signal to control a speed of the inverter in charging/discharging the loading, so that the output terminal outputs a voltage signal; and
   a shaping circuit used for shaping the voltage signal into a spread-spectrum clock signal.

6. The spread-spectrum circuit according to claim 5, wherein the control unit further comprises:
   a first current limiter coupled to the first current source; and
   a second current limiter coupled to the second current source;
   wherein, the control unit, through the first current limiter and the second current limiter, controls changes in the current magnitudes of the first current source and the second current source not to exceed a threshold.

7. The spread-spectrum circuit according to claim 5, further comprising:
   a fixed loading coupled to the output terminal of the inverter to limit the charging/discharging speed of the inverter.

8. The spread-spectrum circuit according to claim 5, further comprising:
   a variable loading coupled to the output terminal of the inverter, wherein a magnitude of the variable loading is controlled by the control unit to limit the charging/discharging speed of the inverter.

* * * * *